(12) United States Patent
Huang

(10) Patent No.: US 9,378,319 B2
(45) Date of Patent: Jun. 28, 2016

(54) CONTACT WINDOW ARRANGING APPARATUS AND CONTACT WINDOW ARRANGING METHOD THEREOF

(71) Applicant: Winbond Electronics Corp., Taichung (TW)

(72) Inventor: Chien-Chin Huang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 173 days.

(21) Appl. No.: 14/287,062

(22) Filed: May 26, 2014

(65) Prior Publication Data

US 2015/0339425 A1 Nov. 26, 2015

(51) Int. Cl.
G06F 17/50 (2006.01)

(52) U.S. Cl.
CPC ............ *G06F 17/5072* (2013.01); *G06F 17/50* (2013.01)

(58) Field of Classification Search
CPC ................. H01L 23/5226; H01L 2225/06541; G06F 17/5068; G06F 17/5072; G06F 17/50
USPC ......................................................... 716/126
See application file for complete search history.

(56) References Cited

U.S. PATENT DOCUMENTS

| | | | | |
|---|---|---|---|---|
| 6,515,374 B1 * | 2/2003 | Banisch | ............... | H01L 23/5226 257/202 |
| 6,763,508 B2 * | 7/2004 | Igarashi | ............... | G06F 17/5068 716/119 |
| 7,989,849 B2 * | 8/2011 | Sherlekar | ............ | G06F 17/5072 257/204 |
| 8,484,599 B2 * | 7/2013 | Sundaresan | ......... | G06F 17/5036 716/108 |
| 2001/0046782 A1 | 11/2001 | Kuo et al. | | |

FOREIGN PATENT DOCUMENTS

| TW | 200913135 | 3/2009 |
|---|---|---|
| TW | 200919633 | 5/2009 |

OTHER PUBLICATIONS

"Office Action of Taiwan Counterpart Application", issued on Dec. 29, 2015, p. 1-p. 4.

* cited by examiner

*Primary Examiner* — Jack Chiang
*Assistant Examiner* — Brandon Bowers
(74) *Attorney, Agent, or Firm* — Jianq Chyun IP Office

(57) ABSTRACT

A contact window arranging apparatus and a contact window arranging method thereof are provided. A first contact window arrangement number and a second contact window arrangement number respectively corresponding to a first boundary and a second boundary are determined according to a first preset distance, and a third contact window arrangement number and a fourth contact window arrangement number respectively corresponding to the first boundary and the second boundary are determined according to a second preset distance, so as to select a total contact window arrangement number with more contact windows. Through taking a horizontal center line and a vertical center line of a rectangular area as benchmarks the contact windows are arranged in a manner corresponding to the total contact window arrangement number.

18 Claims, 7 Drawing Sheets

CONTACT WINDOW ARRANGING APPARATUS AND CONTACT WINDOW ARRANGING METHOD THEREOF

BACKGROUND OF THE INVENTION

1. Field of the Invention

The invention relates to an electronic apparatus and, more particularly, to a contact window arranging apparatus and a contact window arranging method thereof.

2. Description of Related Art

In the semiconductor manufacturing process nowadays, the wire intervals among components are reduced due to the increasing density of the integrated circuits, so that the area of the chip surface is not enough for manufacturing the required interconnects. In order to meet the growing requirements for interconnects after the dimensions of the metal oxide semiconductor (MOS) transistors are gradually reduced, the manufacture of the contact windows gradually becomes necessary in many integrated circuits, and the contact windows can be applied to electrically conduct the conductive layers in different layers.

The position error tolerance of the contact windows is rather low; therefore, if the selected positions of the contact windows are overly close to the edges of the conductive layers, or if the resistance between the conductive layers in different layers is excessively high because the amount of the contact windows is insufficient, the integrated circuits may be unable to operate, and the yield of the finished product will reduce significantly. The contact resistance of the metal conductive wires can be reduced by the maximization of the number of the contact windows, and the mask overlay error of two metal layers and the layer of the contact windows in the lithography manufacturing process can be reduced by centering the positions of the contact windows.

If the number of the contact windows is manually filled in by the layout engineer, and the positions of the contact windows are centered manually by the layout engineer, it is not easy to arrange all of the contact windows to the optimal positions, and the manual fill-in method requires a great amount of time. As a result, it is necessary to replace said manual actions with computer programs.

SUMMARY OF THE INVENTION

The invention provides a contact window arranging apparatus and a contact window arranging method thereof to lower the resistance between conductive layers in different layers or avoid positions of contact windows from being overly close to the edges of the conductive layers, and the contact windows are further arranged to be at ideal positions.

In an embodiment of the invention, a contact window arranging method is adapted to arrange positions of a plurality of contact windows on a rectangular area formed by stacking a first conductive wire layer and a second conductive wire layer, wherein each contact window has a first side and a second side adjacent to each other, and the rectangular area has a first boundary and a second boundary adjacent to each other. The contact window arranging method comprises following steps. A first preset distance between the first sides of the adjacent contact windows and a second preset distance between the second sides of the adjacent contact windows are received. A first contact window arrangement number and a second contact window arrangement number respectively corresponding to the first boundary and the second boundary are determined according to the first preset distance, and a third contact window arrangement number and a fourth contact window arrangement number respectively corresponding to the first boundary and the second boundary are determined according to the second preset distance. A total first contact window arrangement number is defined by a product of the first contact window arrangement number and the fourth contact window arrangement number, and a total second contact window arrangement number is defined by a product of the second contact window arrangement number and the third contact window arrangement number. The total first contact window arrangement number and the total second contact window arrangement number are compared, and a total contact window arrangement number is determined according to a result of comparing the total first contact window arrangement number and the total second contact window arrangement number. Through taking a horizontal center line and a vertical center line of the rectangular area as benchmarks, the contact windows are arranged in a manner corresponding to the determined total contact window arrangement number.

In an embodiment of the invention, a contact window arranging apparatus is adapted to arrange positions of a plurality of contact windows on a rectangular area formed by stacking the first conductive wire layer and the second conductive wire layer, wherein each contact window has a first side and a second side adjacent to each other, and the rectangular area has a first boundary and a second boundary adjacent to each other. The contact window arranging apparatus includes a storage unit and a processing unit. The storage unit stores a first preset distance between the first sides of the adjacent contact windows, a second preset distance between the second sides of the adjacent contact windows, and lengths of the first boundary and the second boundary. The processing unit is coupled to the storage unit and performs an arrangement module to determine the first contact window arrangement number and the second contact window arrangement number respectively corresponding to the first boundary and the second boundary according to the first preset distance and determine the third contact window arrangement number and the fourth contact window arrangement number respectively corresponding to the first boundary and the second boundary according to the second preset distance. The total first contact window arrangement number is defined by the product of the first contact window arrangement number and the fourth contact window arrangement number, and the total second contact window arrangement number is defined by the product of the second contact window arrangement number and the third contact window arrangement number. The processing unit further compares the total first contact window arrangement number and the total second contact window arrangement number, determines the total contact window arrangement number according to a result of comparing the total first contact window arrangement number and the total second contact window arrangement number, and arranges the contact windows in a manner corresponding to the determined total contact window arrangement number through taking a horizontal center line and a vertical center line of the rectangular area as benchmarks.

In view of the above, according to an embodiment of the invention, the first contact window arrangement number and the second contact window arrangement number respectively corresponding to the first boundary and the second boundary are determined according to the first preset distance, and the third contact window arrangement number and the fourth contact window arrangement number respectively corresponding to the first boundary and the second boundary are determined according to the second preset distance. The total first contact window arrangement number is defined by the product of the first contact window arrangement number and the fourth contact window arrangement number, and the total second contact window arrangement number is defined by the product of the second contact window arrangement number and the third contact window arrangement number. One of the total first contact window arrangement number and the total second contact window arrangement number corresponding to more contact windows is selected as the total contact window arrangement number, so as to lower the resistance between the conductive layers in different layers. Besides, the horizontal center line and the vertical center line of the rectangular area are taken as benchmarks to arrange the contact windows in a manner corresponding to the selected total contact window arrangement number, so as to avoid the positions of the contact windows from being overly close to the edges of the conductive layers and further arrange the contact windows to the ideal positions.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DETAILED DESCRIPTION OF DISCLOSED EMBODIMENTS

Figure 1:
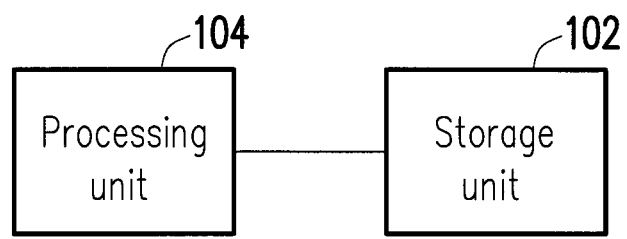
FIG. 1 is a schematic diagram of a contact window arranging apparatus according to an embodiment of the invention.

FIG. 1 is a schematic diagram of a contact window arranging apparatus according to an embodiment of the invention. With reference to FIG. 1, the contact window arranging apparatus includes a storage unit 102 and a processing unit 104, and the storage unit 102 is coupled to the processing unit 104. The positions of a plurality of contact windows on a rectangular area formed by stacking different conductive wire layers can be arranged by the contact window arranging apparatus. As demonstrated in FIG. 2A and FIG. 2B, the region where the conductive wire layer 202 and the conductive wire layer 204 are overlapped forms the rectangular area 206, wherein the conductive wire layer 202 and the conductive wire layer 204 may be semiconductor layers or metal layers, and the shapes of the contact windows and the rectangular area are not limited to the shapes illustrated in FIG. 2A and FIG. 2B, i.e., rectangles or squares. Each contact window C1 respectively has a first side 208-1 and a second side 208-2 adjacent to each other, and the first side 208-1 and the second side 208-2 have preset widths S1 and S2, respectively. Besides, the rectangular area 206 has a first boundary 210-1 and a second boundary 210-2 adjacent to each other, and the lengths of the first boundary 210-1 and the second boundary 210-2 are L1 and L2, respectively.

The storage unit 102 stores the preset widths S1 and S2 of the first side 208-1 and the second side 208-2, a first preset distance d1 between the first sides 208-1 of two adjacent contact windows C1, a second preset distance d2 between the second sides 208-2 of two adjacent contact windows C1, the length L1 of the first boundary 210-1, and the length L2 of the second boundary 210-2. The processing unit 104 determines a first contact window arrangement number and a second contact window arrangement number respectively corresponding to the first boundary 210-1 and the second boundary 210-2 according to the first preset distance d1 and determines a third contact window arrangement number and a fourth contact window arrangement number respectively corresponding to the first boundary 210-1 and the second boundary 210-2 according to the second preset distance d2. Here, a total first contact window arrangement number is defined by a product of the first contact window arrangement number and the fourth contact window arrangement number, and a total second contact window arrangement number is defined by a product of the second contact window arrangement number and the third contact window arrangement number.

Figure 2A:
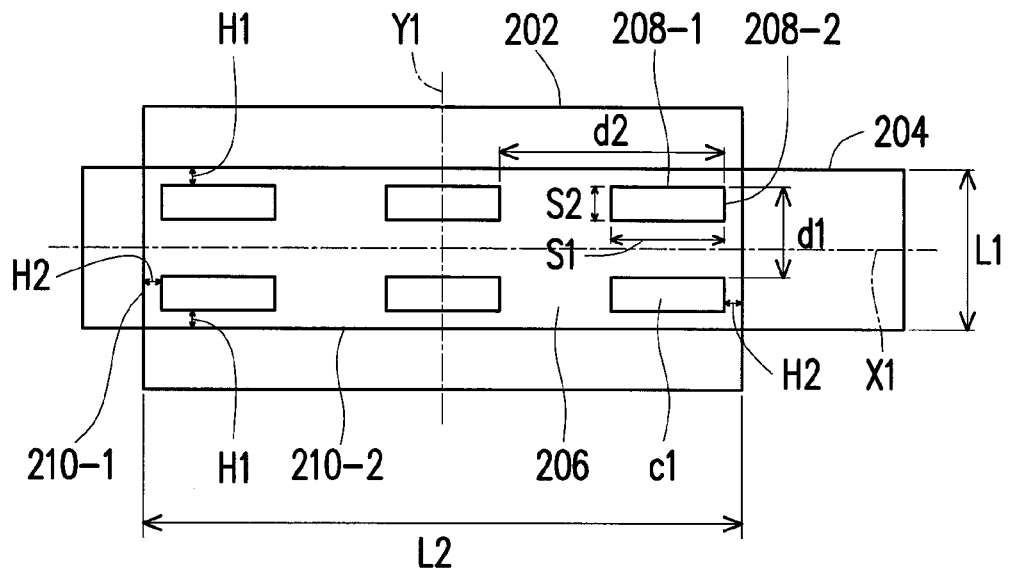
FIG. 2A to FIG. 2H are schematic diagram illustrating arrangement of contact windows according to several embodiments of the invention.

For example, in FIG. 2A, the first contact window arrangement number that corresponds to the first boundary 210-1 and is determined by the processing unit 104 according to the first preset distance d1 is 2, and the fourth contact window arrangement number that corresponds to the second boundary 210-2 and is determined by the processing unit 104 according to the second preset distance d2 is 3, so that the total first contact window arrangement number defined by the first contact window arrangement number and the fourth contact window arrangement number is 6. Besides, in FIG. 2B, the second contact window arrangement number that corresponds to the second boundary 210-2 and is determined by the processing unit 104 according to the second preset distance d2 is 7, and the third contact window arrangement number that corresponds to the first boundary 210-1 and determined by the processing unit 104 according to the first preset distance d1 is 1, so that the total first contact window arrangement number defined by the first contact window arrangement number and the fourth contact window arrangement number is 7.

Figure 2B:
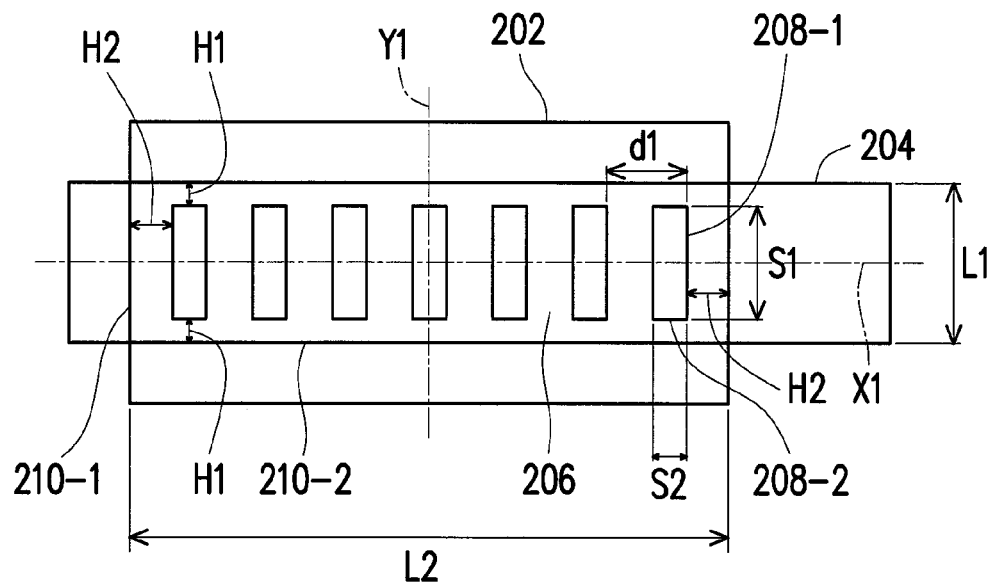
Figure 2C:
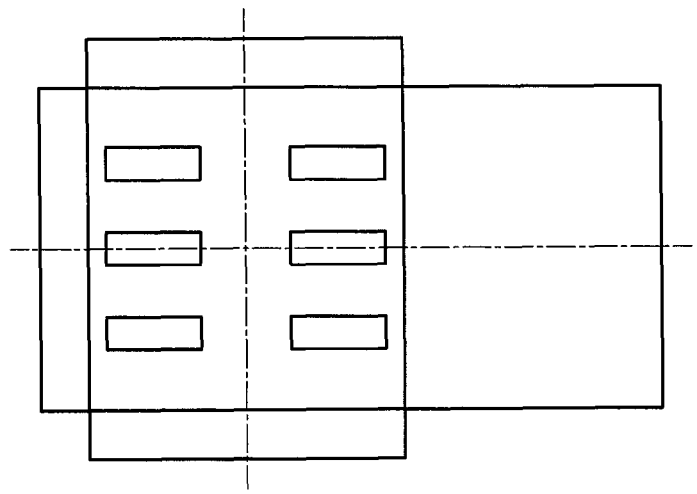
Figure 2D:
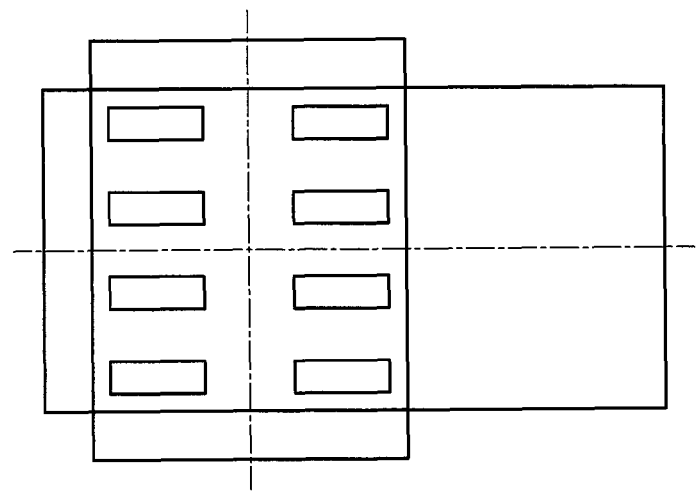
Figure 2E:
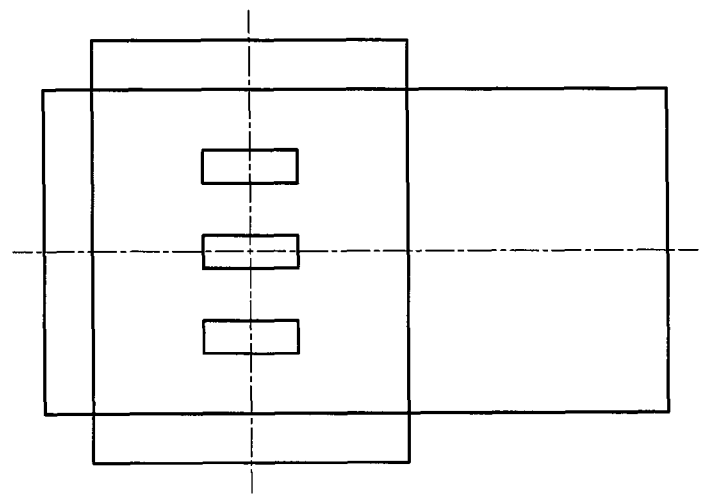
Figure 2F:
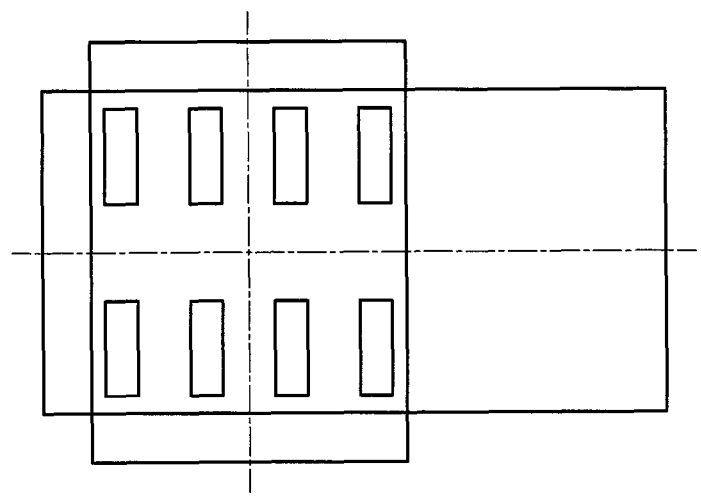
Figure 2G:
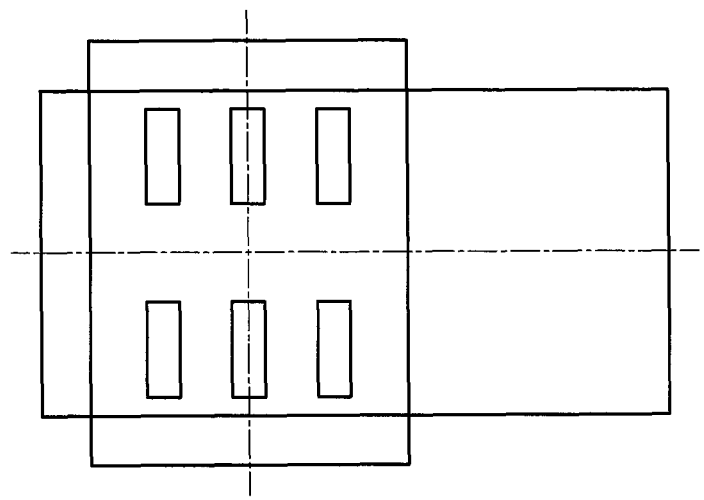
Figure 2H:
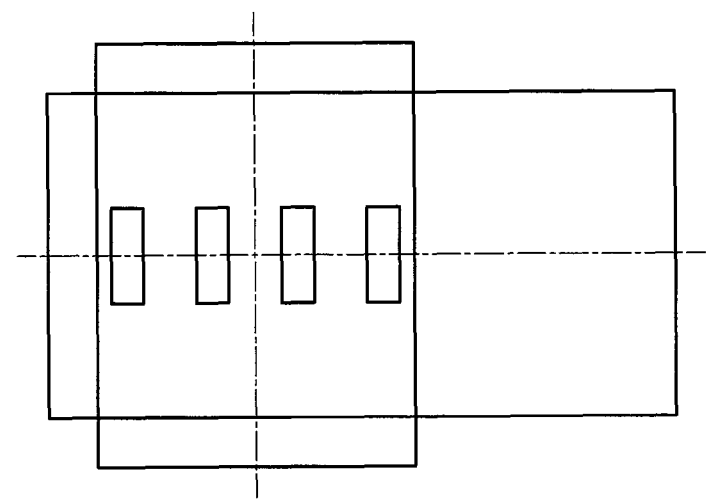

After the total first contact window arrangement number and the total second contact window arrangement number are obtained, the processing unit 104 further compares the total first contact window arrangement number and the total second contact window arrangement number and determines the total contact window arrangement number C1 according to the comparison result of the total first contact window arrangement number and the total second contact window arrangement number. For example, the total first contact window arrangement number shown in FIG. 2A is 6, and the total second contact window arrangement number shown in FIG. 2B is 7. After the processing unit 104 determines that the total second contact window arrangement number is larger than the total second contact window arrangement number, the processing unit 104 selects one of the total first contact window arrangement number and the total second contact window arrangement number corresponding to more contact windows as the total contact window arrangement number (i.e., the total arrangement number of the contact windows C1, for instance, the total contact window arrangement number shown in FIG. 2B). Afterwards, a horizontal center line X1 and a vertical center line Y1 of the rectangular area 206 are taken as benchmarks to arrange the contact windows C1 in a manner corresponding to the selected total contact window arrangement number, so as to lower the resistance between the conductive layers in different layers.

More particularly, when the processing unit 104 arrange the positions of the contact windows C1, at least one critical width can be further kept between each contact window C1 and the boundary of the rectangular area 206, so as to keep the contact windows C1 to be at the central position of the rectangular area 206 and avoid the positions of the contact windows C1 from being overly close to the edges of the conductive layers. As exemplarily shown in FIG. 2A, the method of determining the first contact window arrangement number by the processing unit 104 may include following steps. A first arrangement length is obtained by subtracting a first reserved edge distance from the length L1 of the first boundary 210-1, and the first contact window arrangement number corresponding to the first boundary 210-1 is determined according to the first arrangement length and the first preset distance d1, for example. The length of the first reserved edge distance is the result of multiplying a distance H1 between the contact window C1 and the second boundary 210-2 in FIG. 2A by 2, for example, so as to ensure that the distance between the contact window C1 and the second boundary 210-2 is at least larger than or equal to the distance H1 and avoid the position of the contact window C1 from being overly close to the edge of the conductive layer. The distance H1 can be set as said critical width, for example.

The method of determining the first contact window arrangement number corresponding to the first boundary 210-1 according to the first arrangement length and the first preset distance d1 may include following steps. The first arrangement length is divided by the first preset distance d1, the quotient is rounded to an integer, and whether the remainder obtained from dividing the first arrangement length by the first preset distance d1 is larger than or equal to the second preset width S2 is determined, for example. If the remainder obtained from dividing the first arrangement length by the first preset distance d1 is larger than or equal to the second preset width S2, a value obtained by adding 1 to the integer is deemed the first contact window arrangement number. Besides, if the remainder obtained from dividing the first arrangement length by the first preset distance d1 is smaller than the second preset width S2, the integer is directly deemed the first contact window arrangement number.

Similarly, the method of determining the fourth contact window arrangement number by the processing unit 104 may include following steps. A second arrangement length is obtained by subtracting a second reserved edge distance from the length L2 of the second boundary 210-2, and the fourth contact window arrangement number corresponding to the second boundary 210-2 is determined according to the second arrangement length and the second preset distance d1, for example. The length of the second reserved edge distance is the result of multiplying a distance H2 between the contact window C1 and the first boundary 210-1 in FIG. 2A by 2, for example. Similarly, the method of determining the fourth contact window arrangement number corresponding to the second boundary 210-2 according to the second arrangement length and the second preset distance d2 may include following steps. The second arrangement length is divided by the second preset distance d2, the quotient is rounded to an integer, and whether the remainder obtained from dividing the second arrangement length by the second preset distance d2 is larger than or equal to the first preset width S1 is determined, for example. If the remainder obtained from dividing the second arrangement length by the second preset distance d2 is larger than or equal to the first preset width S1, a value obtained by adding 1 to the integer is deemed the fourth contact window arrangement number. Besides, if the remainder obtained from dividing the second arrangement length by the second preset distance d2 is smaller than the first preset width S1, the integer is directly deemed the fourth contact window arrangement number.

After the maximum number of the contact windows arranged on the first boundary 210-1 (i.e., the first contact window arrangement number) and the maximum number of the contact windows arranged on the second boundary 210-2 (i.e., the fourth contact window arrangement number) are obtained, the maximum number of the contact windows C1 (i.e., the total first contact window arrangement number) arranged in a transverse manner will be further obtained.

In view of the above, the maximum number of the contact windows C1 arranged in a vertical manner (i.e., the total second contact window arrangement number as demonstrated in FIG. 2B) can also be obtained by applying the similar method, and the implementation details can be deduced from the above by those having ordinary skill in the art and thus will not be further described. After the maximum number of the contact windows C1 arranged in the transverse manner and the maximum number of the contact windows C1 arranged in the vertical manner are obtained by applying two methods, the processing unit 104 compares these two methods to decide which one allows more contact windows C1 to be arranged, and one of the total first contact window arrangement number and the total second contact window arrangement number with more contact windows C1 is selected as the total contact window arrangement number.

As mentioned above, the contact window arrangement number is determined to be an odd number or an even number according to the quotient and the remainder obtained by dividing the arrangement length by the preset distance (for example, the first contact window arrangement number corresponding to the first boundary 210-1 is determined according to the first arrangement length and the first preset distance d1), and the contact windows C1 may be transversely or vertically arranged. The transverse or vertical arrangement of the contact windows C1 and the fact that the contact window arrangement number corresponding to the boundary is an odd number or an even number may result in 8 different arrangement types of the contact windows C1. The embodiments shown in FIG. 2A and FIG. 2B disclose 2 arrangement types, and FIG. 2C to FIG. 2H illustrate the remaining 6 arrangement types. Since the arrangements of the contact windows C1 shown in FIG. 2C to FIG. 2H are the same as those depicted in FIG. 2A and FIG. 2B, no further description in this regard is provided hereinafter.

Note that the aforesaid contact windows may be arranged by the processing unit 104 through an arrangement module. The arrangement module includes a calculation module and a comparison module, wherein the calculation of the contact window arrangement number and the total contact window arrangement number is performed by the processing unit 104 through the calculation module, and the comparison of the total first contact window arrangement number and the total second Contact window arrangement number is performed by the processing unit 104 through the comparison module, for example. The calculation module and the comparison module are composed of the Hercules program, for example, and the programming code snippets are stored in the storage unit 102 and include a plurality of commands. Here, the programming code snippets are executed by the processing unit 104. In other embodiments, the calculation module and the comparison module can be hardware components composed of one or a plurality of circuits coupled to and driven by the processing unit 104.

Figure 3:
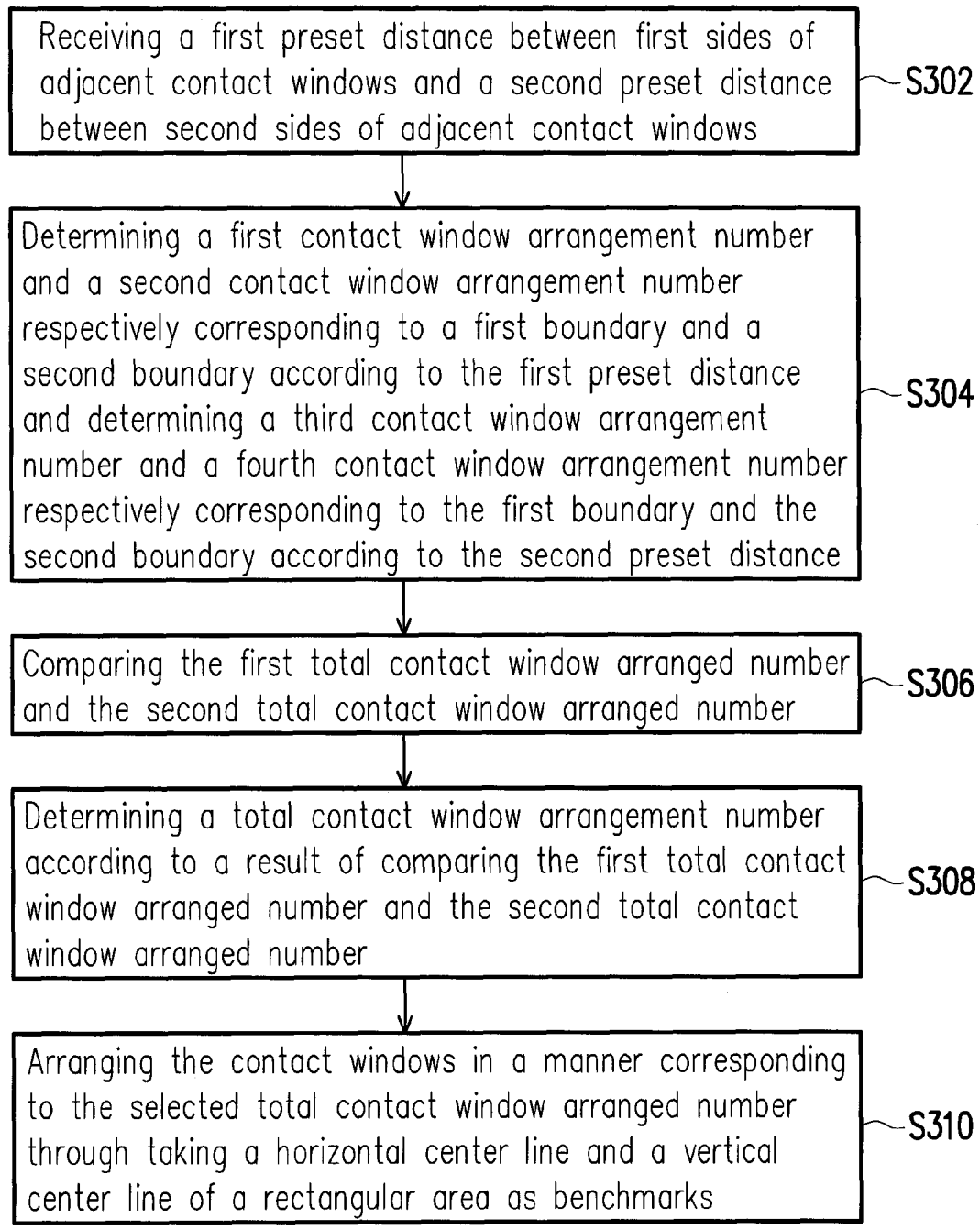
FIG. 3 is a schematic flow chart of a contact window arranging method according to an embodiment of the invention.

FIG. 3 is a schematic flow chart of a contact window arranging method according to an embodiment of the invention. With reference to FIG. 3, the above-mentioned contact window arranging method of the contact window arranging apparatus comprises following steps. The first preset distance between the first sides and the second preset distance between the second sides of adjacent contact windows are received (step S302), wherein the first side of each contact window has the first preset width, and the second side of each contact window has the second preset width. The first contact window arrangement number and the second contact window arrangement number respectively corresponding to the first boundary and the second boundary are determined according to the first preset distance, and the third contact window arrangement number and the fourth contact window arrangement number respectively corresponding to the first boundary and the second boundary are determined according to the second preset distance (step S304), wherein the total first contact window arrangement number is defined by the product of the first contact window arrangement number and the fourth contact window arrangement number, and the total second contact window arrangement number is defined by the product of the second contact window arrangement number and the third contact window arrangement number.

Figure 4:
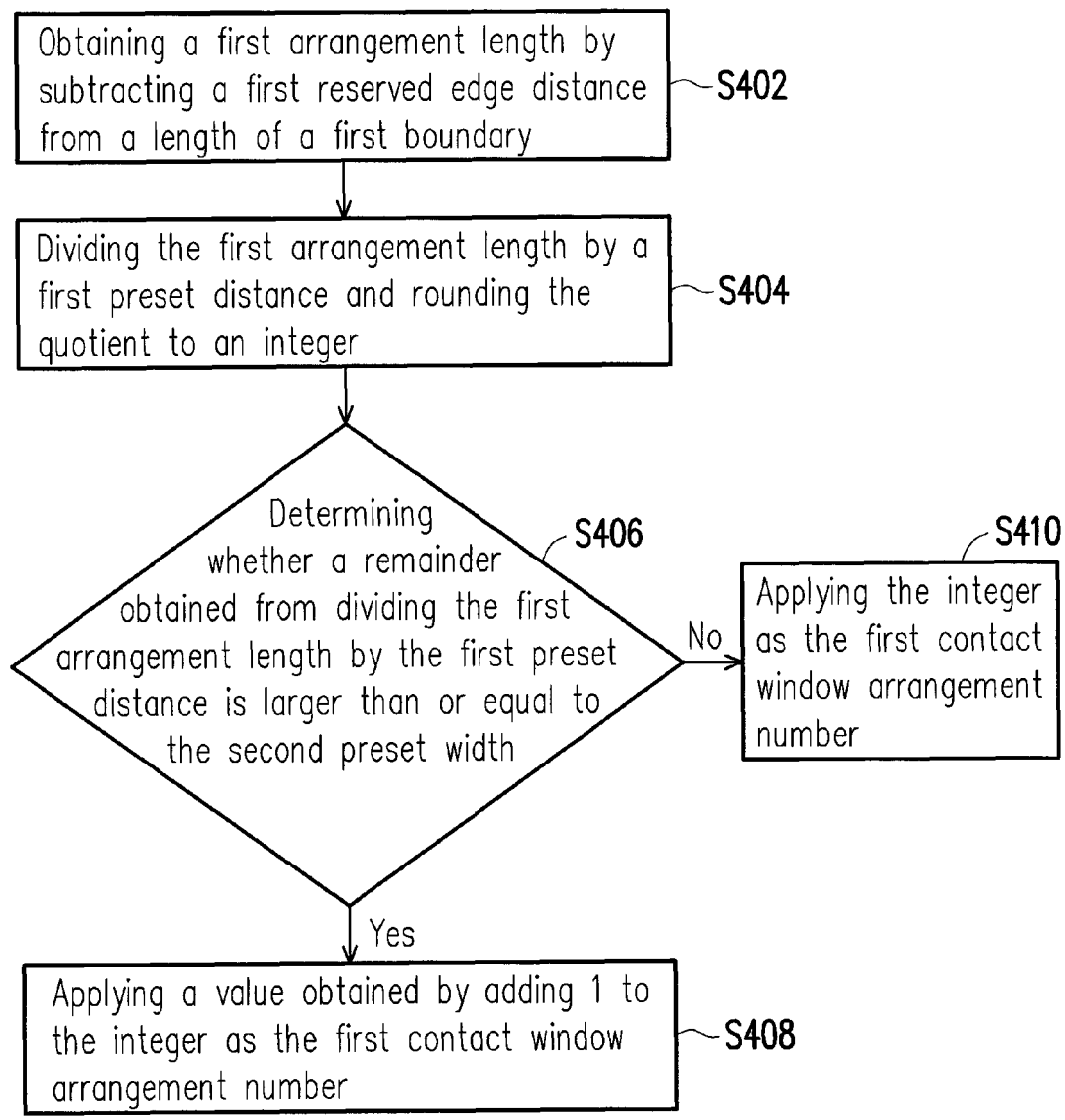
FIG. 4 is a schematic flow chart of a method of determining a first contact window arrangement number according to an embodiment of the invention.

More particularly, the method of determining the first contact window arrangement number corresponding to the first boundary according to the first preset distance is demonstrated in FIG. 4. In the method, the first arrangement length is obtained by subtracting the first reserved edge distance from the length of the first boundary (step S402). The first arrangement length is divided by the first preset distance, and the quotient is rounded to an integer (step S404). It is determined whether the remainder obtained from dividing the first arrangement length by the first preset distance d1 is larger than or equal to the second preset width (step S406). If the remainder obtained from dividing the first arrangement length by the first preset distance is larger than or equal to the second preset width, a value obtained by adding 1 to the integer is applied as the first contact window arrangement number (step S408). Besides, if the remainder obtained from dividing the first arrangement length by the first preset distance is smaller than the second preset width, the integer is applied as the first contact window arrangement number (step S410).

In light of the foregoing, the second contact window arrangement number, the third contact window arrangement number, and the fourth contact window arrangement number can also be obtained through applying the method similar to that shown in FIG. 4, and the implementation details may be deduced from the embodiment shown in FIG. 4 by those having ordinary skill in the art and thus will not be further described hereinafter.

After step S304, the total first contact window arrangement number and the total second contact window arrangement number are further compared (step S306). The total contact window arrangement number is determined according to the comparison result of the total first contact window arrangement number and the total second contact window arrangement number (step S308). For example, one of the total first contact window arrangement number and the total second contact window arrangement number corresponding to more contact windows is selected as the total contact window arrangement number, so as to lower the resistance between the conductive layers in different layers. Finally, the horizontal center line and the vertical center line of the rectangular area are taken as benchmarks to arrange the contact windows in a manner corresponding to the selected total contact window arrangement number (step S310).

To sum up, the first contact window arrangement number and the second contact window arrangement number respectively corresponding to the first boundary and the second boundary are determined according to the first preset distance, and the third contact window arrangement number and the fourth contact window arrangement number respectively corresponding to the first boundary and the second boundary are determined according to the second preset distance in the invention. The total first contact window arrangement number is defined by the product of the first contact window arrangement number and the fourth contact window arrangement number, and the total second contact window arrangement number is defined by the product of the second contact window arrangement number and the third contact window arrangement number. One of the total first contact window arrangement number and the total second contact window arrangement number corresponding to more contact windows is selected as the total contact window arrangement number, so as to lower the resistance between the conductive layers in different layers. Besides, the horizontal center line and the vertical center line of the rectangular area are taken as benchmarks to arrange the contact windows in a manner corresponding to the selected total contact window arrangement number and avoid the positions of the contact windows from being overly close to the edges of the conductive layers, and the contact windows are further arranged to the ideal positions.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A contact window arranging method adapted to arrange positions of a plurality of contact windows on a rectangular area formed by stacking a first conductive wire layer and a second conductive wire layer, wherein each of the contact windows has a first side and a second side adjacent to each other, and the rectangular area has a first boundary and a second boundary adjacent to each other, the contact window arranging method comprising:

receiving a first preset distance between the first sides of adjacent contact windows of the contact windows and a second preset distance between the second sides of adjacent contact windows of the contact windows;

determining a first contact window arrangement number and a second contact window arrangement number respectively corresponding to the first boundary and the second boundary according to the first preset distance and determining a third contact window arrangement number and a fourth contact window arrangement number respectively corresponding to the first boundary and the second boundary according to the second preset distance, wherein a total first contact window arrangement number is defined by a product of the first contact window arrangement number and the fourth contact window arrangement number, and a total second contact window arrangement number is defined by a product of the second contact window arrangement number and the third contact window arrangement number;

comparing the total first contact window arrangement number and the total second contact window arrangement number;

determining a total contact window arrangement number according to a result of comparing the total first contact window arrangement number and the total second contact window arrangement number; and arranging the contact windows in a manner corresponding to the determined total contact window arrangement number through taking a horizontal center line and a vertical center line of the rectangular area as benchmarks, and using the contact windows to manufacture a semiconductor.

2. The contact window arranging method according to claim 1, wherein the first side of each of the contact windows has a first preset width, and the second side of each of the contact windows has a second preset width.

3. The contact window arranging method according to claim 2, wherein the step of determining the first contact window arrangement number corresponding to the first boundary according to the first preset distance comprises:

obtaining a first arrangement length by subtracting a first reserved edge distance from a length of the first boundary;

dividing the first arrangement length by the first preset distance and rounding the quotient to an integer;

determining whether a remainder obtained from dividing the first arrangement length by the first preset distance is larger than or equal to the second preset width;

if the remainder obtained from dividing the first arrangement length by the first preset distance is larger than or equal to the second preset width, applying a value obtained by adding 1 to the integer as the first contact window arrangement number; and if the remainder obtained from dividing the first arrangement length by the first preset distance is smaller than the second preset width, applying the integer as the first contact window arrangement number.

4. The contact window arranging method according to claim 2, wherein the step of determining the second contact window arrangement number corresponding to the second boundary according to the first preset distance comprises:

obtaining a second arrangement length by subtracting a second reserved edge distance from a length of the second boundary;

dividing the second arrangement length by the first preset distance and rounding the quotient to an integer;

determining whether a remainder obtained from dividing the second arrangement length by the first preset distance is larger than or equal to the second preset width;

if the remainder obtained from dividing the second arrangement length by the first preset distance is larger than or equal to the second preset width, applying a value obtained by adding 1 to the integer as the second contact window arrangement number; and if the remainder obtained from dividing the second arrangement length by the first preset distance is smaller than the second preset width, applying the integer as the second contact window arrangement number.

5. The contact window arranging method according to claim 2, wherein the step of determining the third contact window arrangement number corresponding to the first boundary according to the second preset distance comprises:

obtaining a first arrangement length by subtracting a first reserved edge distance from a length of the first boundary;

dividing the first arrangement length by the second preset distance and rounding the quotient to an integer;

determining whether a remainder obtained from dividing the first arrangement length by the second preset distance is larger than or equal to the first preset width;

if the remainder obtained from dividing the first arrangement length by the second preset distance is larger than or equal to the first preset width, applying a value obtained by adding 1 to the integer as the third contact window arrangement number; and if the remainder obtained from dividing the first arrangement length by the second preset distance is smaller than the first preset width, applying the integer as the third contact window arrangement number.

6. The contact window arranging method according to claim 2, wherein the step of determining the fourth contact window arrangement number corresponding to the second boundary according to the second preset distance comprises:

obtaining a second arrangement length by subtracting a second reserved edge distance from a length of the second boundary;

dividing the second arrangement length by the second preset distance and rounding the quotient to an integer;

determining whether a remainder obtained from dividing the second arrangement length by the second preset distance is larger than or equal to the first preset width;

if the remainder obtained from dividing the second arrangement length by the second preset distance is larger than or equal to the first preset width, applying a value obtained by adding 1 to the integer as the fourth contact window arrangement number; and if the remainder obtained from dividing the second arrangement length by the second preset distance is smaller than the first preset width, applying the integer as the fourth contact window arrangement number.

7. The contact window arranging method according to claim 1, wherein the step of determining the total contact window arrangement number according to the result of comparing the total first contact window arrangement number and the total second contact window arrangement number comprises:

selecting one of the total first contact window arrangement number and the total second contact window arrangement number corresponding to more contact windows as the total contact window arrangement number.

8. The contact window arranging method according to claim 1, wherein the contact windows and the rectangular area are rectangles or squares.

9. The contact window arranging method according to claim 1, wherein the first conductive wire layer and the second conductive wire layer are semiconductor layers or metal layers.

10. A contact window arranging apparatus adapted to arrange positions of a plurality of contact windows on a rectangular area formed by stacking a first conductive wire layer and a second conductive wire layer, wherein each of the contact windows has a first side and a second side adjacent to each other, and the rectangular area has a first boundary and a second boundary adjacent to each other, the contact window arranging apparatus comprising:

a storage unit storing a first preset distance between the first sides of adjacent contact windows of the contact windows, a second preset distance between the second sides of adjacent contact windows of the contact windows, and lengths of the first boundary and the second boundary;

a processing unit coupled to the storage unit, the processing unit performing an arrangement module to detennine a first contact window arrangement number and a second contact window arrangement number respectively corresponding to the first boundary and the second boundary according to the first preset distance and determine a third contact window arrangement number and a fourth contact window arrangement number respectively corresponding to the first boundary and the second boundary according to the second preset distance, wherein a total first contact window arrangement number is defined by a product of the first contact window arrangement number and the fourth contact window arrangement number, and a total second contact window arrangement number is defined by a product of the second contact window arrangement number and the third contact window arrangement number, the processing unit further comparing the total first contact window arrangement number and the total second contact window arrangement number, determining a total contact window arrangement number according to a result of comparing the total first contact window arrangement number and the total second contact window arrangement number, and arranging the contact windows in a manner corresponding to the determined total contact window arrangement number through taking a horizontal center line and a vertical center line of the rectangular area as benchmarks, and using the contact windows to manufacture a semiconductor.

11. The contact window arranging apparatus according to claim 10, wherein the storage unit further stores a first preset width of the first side of each of the contact windows and a second preset width of the second side of each of the contact windows.

12. The contact window arranging apparatus according to claim 11, wherein the processing unit further subtracts a first reserved edge distance from the length of the first boundary to obtain a first arrangement length, divides the first arrangement length by the first preset distance and rounds the quotient to an integer, and determines whether a remainder obtained from dividing the first arrangement length by the first preset distance is larger than or equal to the second preset width, if the remainder obtained from dividing the first arrangement length by the first preset distance is larger than or equal to the second preset width, the processing unit applies a value obtained by adding 1 to the integer as the first contact window arrangement number, and if the remainder obtained from dividing the first arrangement length by the first preset distance is smaller than the second preset width, the processing unit applies the integer as the first contact window arrangement number.

13. The contact window arranging apparatus according to claim 11, wherein the processing unit further subtracts a second reserved edge distance from the length of the second boundary to obtain a second arrangement length, divides the second arrangement length by the first preset distance and rounds the quotient to an integer, and determines whether a remainder obtained from dividing the second arrangement length by the first preset distance is larger than or equal to the second preset width, if the remainder obtained from dividing the second arrangement length by the first preset distance is larger than or equal to the second preset width, the processing unit applies a value obtained by adding 1 to the integer as the second contact window arrangement number, and if the remainder obtained from dividing the second arrangement length by the first preset distance is smaller than the second preset width, the processing unit applies the integer as the second contact window arrangement number.

14. The contact window arranging apparatus according to claim 11, wherein the processing unit further subtracts a first reserved edge distance from the length of the first boundary to obtain a first arrangement length, divides the first arrangement length by the second preset distance and rounds the quotient to an integer, and determines whether a remainder obtained from dividing the first arrangement length by the second preset distance is larger than or equal to the first preset width, if the remainder obtained from dividing the first arrangement length by the second preset distance is larger than or equal to the first preset width, the processing unit applies a value obtained by adding 1 to the integer as the third contact window arrangement number, and if the remainder obtained from dividing the first arrangement length by the second preset distance is smaller than the first preset width, the processing unit applies the integer as the third contact window arrangement number.

15. The contact window arranging apparatus according to claim 11, wherein the processing unit further subtracts a second reserved edge distance from the length of the second boundary to obtain a second arrangement length, divides the second arrangement length by the second preset distance and rounds the quotient to an integer, and determines whether a remainder obtained from dividing the second arrangement length by the second preset distance is larger than or equal to the first preset width, if the remainder obtained from dividing the second arrangement length by the second preset distance is larger than or equal to the first preset width, the processing unit applies a value obtained by adding 1 to the integer as the fourth contact window arrangement number, and if the remainder obtained from dividing the second arrangement length by the second preset distance is smaller than the first preset width, the processing unit applies the integer as the fourth contact window arrangement number.

16. The contact window arranging apparatus according to claim 10, wherein the processing unit further selects one of the total first contact window arrangement number and the total second contact window arrangement number corresponding to more contact windows as the total contact window arrangement number.

17. The contact window arranging apparatus according to claim 10, wherein the contact windows and the rectangular area are rectangles or squares.

18. The contact window arranging apparatus according to claim 10, wherein the first conductive wire layer and the second conductive wire layer are semiconductor layers or metal layers.

* * * * *